(12) United States Patent
Theuss

(10) Patent No.: US 7,598,126 B2
(45) Date of Patent: Oct. 6, 2009

(54) USE OF NANOSCALE PARTICLES FOR CREATING SCRATCH-RESISTANT PROTECTIVE LAYERS ON SEMICONDUCTOR CHIPS

(75) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 234 days.

(21) Appl. No.: 11/526,862

(22) Filed: Sep. 26, 2006

(65) Prior Publication Data
US 2007/0052052 A1    Mar. 8, 2007

Related U.S. Application Data

(63) Continuation of application No. PCT/DE2005/000476, filed on Mar. 16, 2005.

(30) Foreign Application Priority Data
Mar. 26, 2004 (DE) .................. 10 2004 015 403

(51) Int. Cl.
*H01L 21/00* (2006.01)
*H01L 23/29* (2006.01)
(52) U.S. Cl. .................. 438/127; 257/789; 257/795; 257/E21.502
(58) Field of Classification Search .................. None
See application file for complete search history.

(56) References Cited

U.S. PATENT DOCUMENTS

| 4,254,426 | A | 3/1981 | Pankove |
| 6,365,269 | B1 | 4/2002 | Atzesdorfer et al. |
| 6,469,086 | B1 | 10/2002 | Neu et al. |
| 2003/0047111 | A1 | 3/2003 | Niume et al. |
| 2003/0161959 | A1 | 8/2003 | Kodas et al. |

FOREIGN PATENT DOCUMENTS

| DE | 10059487 A1 | 6/2002 |
| DE | 10153176 A1 | 3/2003 |
| JP | 03178123 A | 8/1991 |
| WO | 0106754 A1 | 9/2001 |
| WO | 0232588 A1 | 4/2002 |

OTHER PUBLICATIONS

H.-Q. Nguyen et al., "Thermische Aufbringung neuartiger Korrosionsschichten für Leichtmetalle auf der Basis oxidischer Nanopartikel," Karl-Winnacker-Institu der Dechema e.V., Franfurt am Main, Jan. 2004, with English translation of citation.

*Primary Examiner*—Alonzo Chambliss
(74) *Attorney, Agent, or Firm*—Edell, Shapiro & Finnan, LLC

(57) ABSTRACT

Inorganic-based nanoparticles, such as nanoparticles based on silicon dioxide, are used in order to produce protective layers for semiconductor chips having scratch-resistant properties. The nanoparticles are preferably processed to form a sol, which is applied onto the semiconductor chips to be coated and subsequently converted by sintering into the protective layer.

14 Claims, 1 Drawing Sheet

USE OF NANOSCALE PARTICLES FOR CREATING SCRATCH-RESISTANT PROTECTIVE LAYERS ON SEMICONDUCTOR CHIPS

CROSS REFERENCE TO RELATED APPLICATIONS

This application is a continuation of International Application No. PCT/DE2005/000476, filed on Mar. 16, 2005, entitled "Use of Nanoscale Particles for Creating Scratch-Resistant Protective Layers on Semiconductor Chips," which claims priority under 35 U.S.C. §119 to Application No. DE 102004015403.1 filed on Mar. 26, 2004, entitled "Use of Nanoscale Particles for Creating Scratch-Resistant Protective Layers on Semiconductor Chips," the entire contents of which are hereby incorporated by reference.

FIELD OF THE INVENTION

The invention relates to providing protective layers for semiconductor chips.

BACKGROUND

Protective layers based on nanoscale particles are known from the following publication: "Thermische Aufbringung neuartiger Korrosionsschutzschichten für Leichtmetalle auf der Basis oxidischer Nanopartikel" [Thermal application of novel corrosion protection layers for light metals based on oxidic nanoparticles], H.-Q. Nguyen, W. Fürbeth, M Schütze, Karl—Winnacker-Institut of DECHEMA e. V, Frankfurt am Main, the disclosure of which is incorporated herein by reference in its entirety. Protective layers based on polymeric or particulate sols are disclosed, which can be applied onto a workpiece surface as a sol by simple mechanical coating techniques such as dip and spin coating. The resulting protective layers are purely inorganic, transparent and curable or sinterable even at a low temperature and have a high microhardness in addition to a very good corrosion protection effect.

Protective layers based on nanoscale particles are already applied onto glass and plastic surfaces, in order to provide them with a water- and dirt-repellent surface (i.e., a lotus effect).

The use of protective layers based on nanoscale particles for producing scratch-resistant varnishes for automobile paint is also being studied.

In recent years, the need has likewise arisen in the semiconductor industry to protect unencapsulated semiconductor chips particularly against mechanical damage such as scratches in a simple and reliable way.

There are two reasons for this need. On the one hand, unencapsulated semiconductor chips are handled in a semiconductor assembly as an inherent result of the process. On the other hand, in particular package types, so-called "bare dice" or unencapsulated semiconductor chips are used which remain unencapsulated, for example, in order to improve the heat transport out of the semiconductor chip or in order to minimize the space requirement of the semiconductor component. Both cases entail the risk that the corresponding semiconductor component will become damaged by scratches, particularly as a result of handling.

SUMMARY

The present invention provides a method for producing a protective film on semiconductor chips, which protects the semiconductor chips against mechanical damage or scratches.

In accordance with the present invention, nanoscale particles are used for producing protective layers, in particular scratch-resistant protective layers on semiconductor chips. In particular, nanoparticle-based and/or nanocomposite-based coatings, which are preferably produced using a sol-gel process and applied by simple and conventional methods such as immersion, casting, spraying, printing, rolling, dip coating, spin coating and the like, are suitable for protecting a semiconductor chip.

The above and still further features and advantages of the present invention will become apparent upon consideration of the following detailed description of specific embodiments thereof, particularly when taken in conjunction with the accompanying drawing.

DETAILED DESCRIPTION

Figure 1:
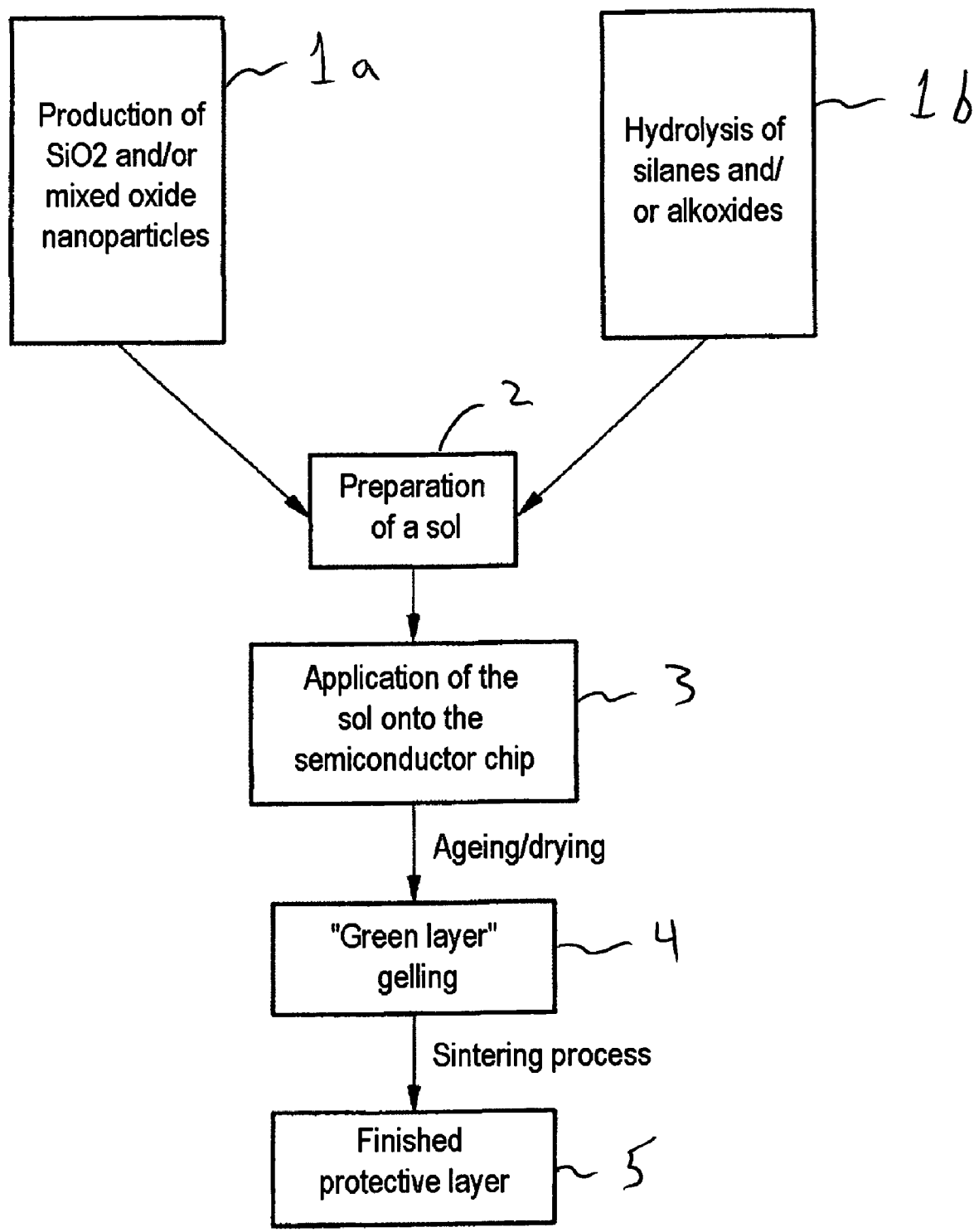
FIG. 1 shows a flowchart outlining a process for forming a protective layer in accordance with the invention.

Nanoscale particles are formed for producing protective layers in accordance with the invention, in particular scratch-resistant protective layers on semiconductor chips. As used herein, the term "nanoscale" in relation to particles refers to particles having sizes or dimensions (e.g., diameters) no greater than about 100 nanometers (nm). In particular, nanoparticle-based and/or nanocomposite-based coatings, which are preferably produced using a sol-gel process and applied by simple and conventional methods such as immersion, casting, spraying, printing, rolling, dip coating, spin coating and the like, are suitable for protecting a semiconductor chip.

The use of nanoparticle-based coatings according to the invention provides a number of advantages including, without limitation, that further properties can be imparted to the coating by the selection of suitable nanoparticles and/or additional doping. In addition to protecting against scratches, the unencapsulated semiconductor chip can further be protected, for example, against light or UV radiation, dirt particles, moisture and/or uncontrolled electrostatic discharges by selecting appropriate nanoparticles for the coatings in accordance with the invention.

Sols which contain the nanoparticles either in a particulate or polymeric form, and which can be applied in a simple way onto the semiconductor chips to be coated, are preferably used for preparing the scratch-resistant coatings according to the invention. All conventional methods for applying a liquid are suitable for applying a sol, such as immersion, casting, spraying, printing, rolling and, particularly for producing layers with an accurately defined thickness, dip or spin coating.

Nanoparticles, the synthesis of which can be achieved by a variety of different conventional methods, are used for particulate sols. An example of industrial synthesis is the Aerosil® process, which involves a continuous flame pyrolysis of silicon tetrachloride ($SiCl_4$). The $SiCl_4$ is converted into the gas phase and subsequently reacts spontaneously and quantitatively inside an oxyhydrogen flame with the intermediary formed water to form the desired silicon oxide. By varying the concentration of the reaction partners, the flame temperature and the residence time of the silica in the combustion space, it is possible to influence the particle sizes, the particle distribution, the specific surface as well as their constitution in wide limits. In a subsequent step, a suspension or a sol is then produced from the nanoparticles by using a dispersant.

It is furthermore known that other oxides, such as aluminum oxide or titanium oxide, alkali metal oxides and/or further metal and/or ceramic mixed oxides can respectively be used as the nanoparticles as an alternative or in addition to silicon dioxide in order to impart other properties to the protective layer.

Branched silane macromolecules are needed for preparing polymeric sols. These are prepared under acid catalysis starting from silanes. Other alkoxides can also be used so that it is possible to produce multicomponent nanoparticles and therefore protective layers with different properties.

After the sol has been prepared, it is applied by customary mechanical methods for applying liquids as a thin layer onto the semiconductor chip to be coated.

Based on the use of methods such as immersion, casting, spraying, printing or rolling, it is readily possible to use a coating according to the present invention in a way which is compatible with mass production in semiconductor fabrication.

The applied sol layer is then converted into a gel layer, the so-called green layer, by flocculation or aging and/or drying. The green layer is subsequently converted into the scratch-resistant protective layer according to the invention by a sintering process, optionally with the aid of sintering additives to reduce the sintering temperature.

These method steps are collated or set forth in a flow chart depicted in FIG. 1. In particular, the steps of FIG. 1 are as follows. Nanoparticles can be produced from silicon oxide and/or mixed oxide particles (step 1a), and/or by hydrolysis of silanes and/or alkoxides (step 1b). A sol is prepared with such nanoparticles (step 2). The sol is then applied onto a semiconductor chip (step 3) and then converted to a green layer (step 4). The green layer is then converted to the finished protective layer (step 5), for example, via a sintering process.

Possible sintering temperatures for such a process may be about 400 degrees Celsius, as is known (e.g., as set forth in above-identified publication of H.-Q. Nguyen et al.). Temperatures of about 400 degrees Celsius are known and usual in semiconductor assembly, for example, in eutectic or soft solder chip assembly processes. For heat-sensitive semiconductor chips, it is furthermore possible to achieve lower sintering temperatures with efficient reaction rates by using so-called sintering additives.

The following procedure is adopted in one exemplary embodiment to produce a protective film, for example from a borosilicate sol, on a wafer of semiconductor chips according to the invention.

The silanes are first prehydrolyzed. Triethyl borate is then added. This procedure is necessary in order to compensate for the faster hydrolysis rate of triethyl borate. Because of the high susceptibility of triethyl borate to heterogeneous precipitation of a boric acid phase under air humidity, the borosilicate gel is prepared in a protective chamber flushed with nitrogen. The resulting glass-clear multioxide sol is made ready for coating by storing at room temperature for about 8 hours.

In order to coat the wafer with the sol by spin coating, the sol is first applied with a pipette and the wafer is subsequently spun by rotation. The sol layer thickness can in this case be determined by selecting the rotation speed.

The applied sol layer is converted into the green layer by gelling the sol particles or aging the layer with evaporation of the solvent. The wafer with the green layer is subsequently kept in a drying oven under synthetic air at approximately 400 degrees Celsius for approximately about 4-10 hours, the green layer becoming condensed to form a vitreous coat.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A method for coating semiconductor chips with nanoscale particles, comprising:
    producing nanoparticles comprising at least one of silicon dioxide particles, metal particles and ceramic oxide particles;
    preparing a sol of the nanoparticles;
    coating semiconductor chips with the sol;
    forming a gel layer or green layer from the sol by at least one of aging and drying the semiconductor chips coated with the sol; and
    forming a protective layer on the semiconductor chips by sintering the semiconductor chips coated with the gel layer or green layer.

2. The method of claim 1, wherein sintering additives are added to reduce the sintering temperature required to form the protective layer.

3. A semiconductor chip including a protective layer coating at least a portion of the semiconductor chip, the protective layer comprising nanoscale particles, wherein the semiconductor chip with protective layer has been formed by the method of claim 1.

4. The method of claim 1, wherein the entire surface of at least one side of each of the semiconductor chips is coated with the sol.

5. The method of claim 1, wherein the coating of the semiconductor chips with the sol is achieved by immersion of the semiconductor chips in the sol.

6. The method of claim 1, wherein the coating of the semiconductor chips with the sol is achieved by spin coating the sol on at least one surface of the semiconductor chips.

7. The method of claim 1, wherein the protective layer formed on each of the semiconductor chips comprises a scratch-resistant coating.

8. A method for coating semiconductor chips with nanoscale particles, comprising:
    hydrolyzing at least one of silanes and alkoxides to form a hydrolyzed material;
    preparing a sol with the hydrolyzed material;
    coating semiconductor chips with the sol;
    forming a gel layer or green layer from the sol by at least one of aging and drying the semiconductor chips coated with the sol; and
    forming a protective layer on the semiconductor chips by sintering the semiconductor chips coated with the gel layer or green layer.

9. The method of claim 8, wherein sintering additives are added to reduce the sintering temperature required to form the protective layer.

10. A semiconductor chip including a protective layer coating at least a portion of the semiconductor chip, the protective layer comprising nanoscale particles, wherein the semiconductor chip with protective layer has been formed by the method of claim 8.

11. The method of claim 8, wherein the entire surface at least one side of each of the semiconductor chips is coated with the sol.

12. The method of claim 8, wherein the coating of the semiconductor chips with the sol is achieved by immersion of the semiconductor chips in the sol.

13. The method of claim 8, wherein the coating of the semiconductor chips with the sol is achieved by spin coating the sol on at least one surface of the semiconductor chips.

14. The method of claim 8, wherein the protective layer formed on each of the semiconductor chips comprises a scratch-resistant coating.

* * * * *